United States Patent
Wu et al.

(10) Patent No.: US 9,037,945 B2
(45) Date of Patent: May 19, 2015

(54) GENERATING PARTIALLY SPARSE GENERATOR MATRIX FOR A QUASI-CYCLIC LOW-DENSITY PARITY-CHECK ENCODER

(71) Applicant: LSI Corporation, San Jose, CA (US)

(72) Inventors: YingQuan Wu, Palo Alto, CA (US); Ivana Djurdjevic, Milpitas, CA (US); Alexander Hubris, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 106 days.

(21) Appl. No.: 13/852,852

(22) Filed: Mar. 28, 2013

(65) Prior Publication Data
US 2014/0298129 A1    Oct. 2, 2014

Related U.S. Application Data
(60) Provisional application No. 61/805,270, filed on Mar. 26, 2013.

(51) Int. Cl.
*H03M 13/00* (2006.01)
*H03M 13/11* (2006.01)

(52) U.S. Cl.
CPC .......... *H03M 13/116* (2013.01); *H03M 13/611* (2013.01); *H03M 13/616* (2013.01)

(58) Field of Classification Search
CPC ............................ H03M 13/09; H04L 1/0061
USPC .......... 714/758, 756, 776, 774, 804, 807, 752
See application file for complete search history.

(56) References Cited

U.S. PATENT DOCUMENTS

| | | | |
|---|---|---|---|
| 7,477,710 B2 * | 1/2009 | Narayan et al. | 375/349 |
| 8,051,357 B1 | 11/2011 | Varnica | |
| 8,219,868 B1 | 7/2012 | Chaichanavong et al. | |
| 8,255,765 B1 * | 8/2012 | Yeo et al. | 714/758 |

OTHER PUBLICATIONS
Zongwang Li, et al, Efficient Encoding of Quasi-Cyclic Low-Density Parity-Check Codes, IEEE Transactions on Communications, vol. 54, No. 1, Jan. 2006, pp. 71-81.

\* cited by examiner

*Primary Examiner* — Fritz Alphonse
(74) *Attorney, Agent, or Firm* — Suiter Swantz pc llo

(57) ABSTRACT

A method and system for constructing a generator matrix is disclosed. The method includes: receiving a parity check matrix H, wherein the parity check matrix H includes multiple circulant sub-matrices; rearranging the parity check matrix H by column and row permutations to obtain a rearranged parity check matrix H'; and constructing the generator matrix G based on the rearranged parity check matrix H'.

20 Claims, 9 Drawing Sheets

GENERATING PARTIALLY SPARSE GENERATOR MATRIX FOR A QUASI-CYCLIC LOW-DENSITY PARITY-CHECK ENCODER

CROSS-REFERENCE TO RELATED APPLICATIONS

Noon The present application claims the benefit under 35 U.S.C. §119(e) of U.S. Provisional Application Ser. No. 61/805,270, filed Mar. 26, 2013. Said U.S. Provisional Application Ser. No. 61/805,270 is hereby incorporated by reference in its entirety.

TECHNICAL FIELD

The present invention relates to the field of error correction and particularly to a quasi-cyclic low-density parity-check encoder.

BACKGROUND

In information theory, a low-density parity-check (LDPC) code is a linear error correcting code, which is commonly used as a method of transmitting a message over a noisy transmission channel.

SUMMARY

Accordingly, an embodiment of the present disclosure is directed to a method for constructing a generator matrix using a computer processor. The method includes: receiving a parity check matrix H, wherein the parity check matrix H includes multiple circulant sub-matrices; rearranging the parity check matrix H by column and row permutations to obtain a rearranged parity check matrix H'; and constructing the generator matrix G based on the rearranged parity check matrix H'.

A further embodiment of the present disclosure is directed to a system for constructing a generator matrix. The system includes a generator matrix construction module configured for: receiving a parity check matrix H, wherein the parity check matrix H includes multiple circulant sub-matrices; rearranging the parity check matrix H by column and row permutations to obtain a rearranged parity check matrix H'; and constructing the generator matrix G based on the rearranged parity check matrix H'. The system further includes a generator matrix memory in communication with the generator matrix construction module. The generator matrix memory is configured for storing the generator matrix G constructed.

An additional embodiment of the present disclosure is directed to a computer-readable device having computer-executable instructions for performing a method for constructing a generator matrix. The method includes: receiving a parity check matrix H having a plurality of q×q circulant sub-matrices; rearranging the parity check matrix H by column and row permutations to obtain a rearranged parity check matrix H'; and constructing the generator matrix G based on H'.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Low-density parity-check (LDPC) codes can be constructed from circulant permutation matrices, and such LDPC codes are commonly referred to as quasi-cyclic (QC) LDPC codes. Encoding of QC LDPC codes is described in: Efficient Encoding of Quasi-Cyclic Low-Density Parity-Check Codes, Zongwang Li et al., IEEE Transactions on Communications, Vol. 54, No. 1 (January 2006), which is herein incorporated by reference in its entirety.

QC LDPC codes are commonly described by their sparse parity check matrix that defines the null space of the code. A parity check matrix is generally given in a circulant block form:

$$H = \begin{bmatrix} H_{1,1} & H_{1,2} & \ldots & H_{1,N} \\ H_{2,1} & H_{2,2} & \ldots & H_{2,N} \\ \vdots & \vdots & \ddots & \vdots \\ H_{M,1} & H_{M,2} & \ldots & H_{M,N} \end{bmatrix}$$

Wherein each sub-matrix $H_{i,j}$ is a q×q circulant matrix and is either a zero matrix or a circulant permutation matrix, i.e. with a column and row weight of one. This constraint reduces the encoder/decoder complexity and simplifies the code search process.

In coding theory, a generator matrix is a basis for a linear code, generating all its possible codewords. For a given QC LDPC matrix, there exists a generator matrix G in circulant block form:

$$G = \begin{bmatrix} I & 0 & \ldots & 0 & G_{1,1} & G_{1,2} & \ldots & G_{1,M} \\ 0 & I & \ldots & 0 & G_{2,1} & G_{2,2} & \ldots & G_{2,M} \\ \vdots & \vdots & \ddots & \vdots & \vdots & \vdots & \ddots & \vdots \\ 0 & 0 & \ldots & I & G_{N-M,1} & G_{N-M,2} & \ldots & G_{N-M,M} \end{bmatrix}$$

Wherein each sub-matrix $G_{i,j}$ is of the same size as $H_{i,j}$ (i.e., q×q) and is also in a circulant form.

Figure 1:
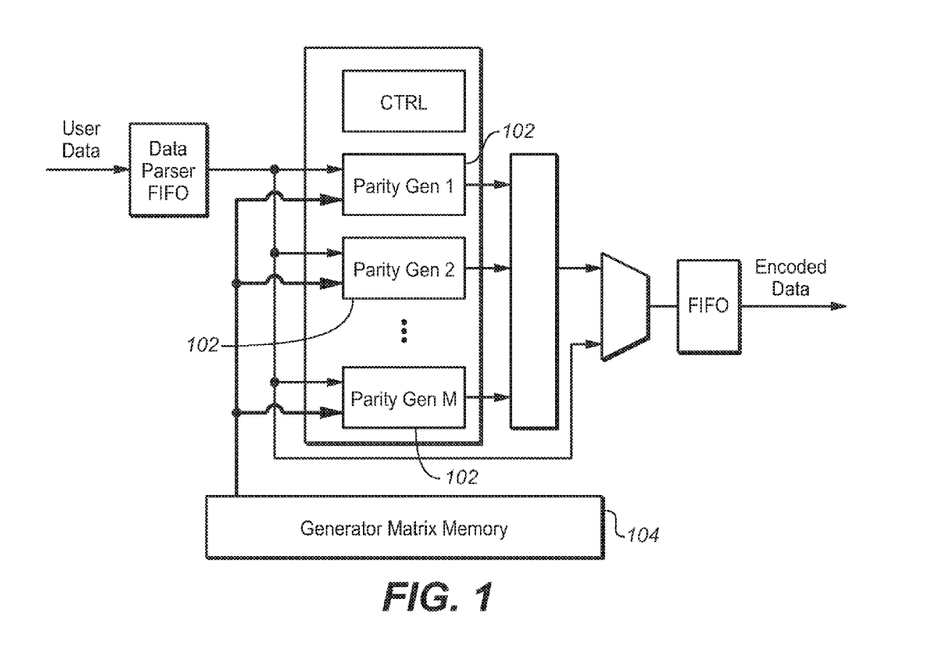
FIG. 1 is a block diagram illustrating a quasi-cyclic low-density parity-check encoder (QC LDPC) encoder.

FIG. 1 is a block diagram illustrating a QC LDPC encoder 100. M parity generator blocks 102 are utilized for the encoding process. Typically, the i-th parity generator block (Parity Gen i) takes q user bits at its input (where q is the circulant size described above) and computes parity updates from those q user bits for the i-th block. To perform such updates, the i-th Parity Gen block needs to know the sub-matrix $G_{j,i}$, where j corresponds to the j-th block of q user bits currently processed. Therefore, in this implementation, each Parity Gen block 102 requires q flip-flops to store one row of a sub-matrix of G (loaded from the Generator matrix memory 104), q flip-flops to store q parity bits and logic circuit that updates the parity.

Figure 2:
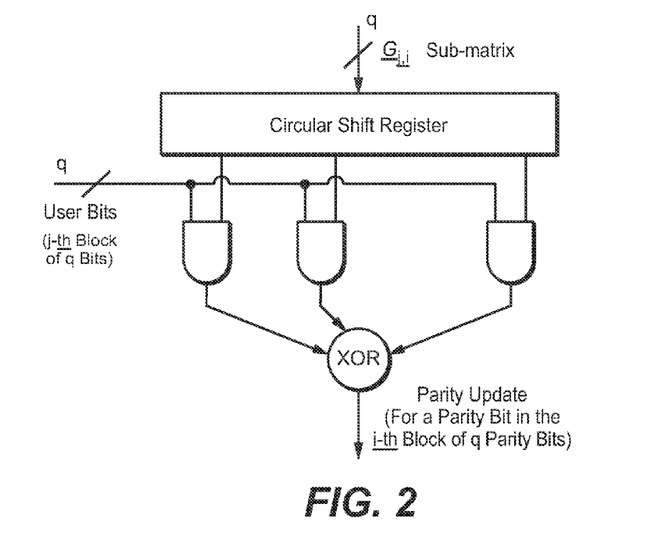
FIG. 2 is a block diagram illustrating a parity update circuit for completing q updates in q cycles.

FIG. 2 is a block diagram illustrating a parity update circuit. It is noted that the parity update circuit complexity depends on the number of cycles available. For instance, if the required throughput allows the circuit to complete each update in q cycles, then q 2-input AND gates and 1 q-input XOR gate can be utilized as illustrated in FIG. 2, which has a relatively small complexity. However, if the required throughput dictates the computation to be completed in q/n cycles, the complexity increases n times.

Now, it is noted that while the sub-matrices $H_{i,j}$ are low density (sparse), sub-matrices $G_{i,j}$ are usually dense. However, if the generator matrix G can be arranged so that some of the $G_{i,j}$ sub-matrices are sparse circulants (i.e. zero circulants or circulants that contain just one '1' in each column/row), the efficiency of the parity generation process can be improved.

In accordance with an embodiment of the present disclosure, a method and system to construct partially sparse generator matrix for a quasi-cyclic low-density parity-check encoder is disclosed.

Figure 3:
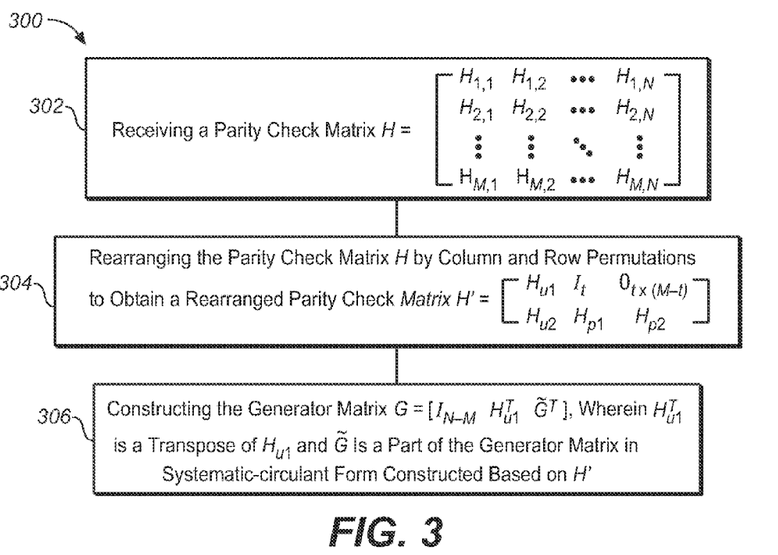
FIG. 3 is a flow diagram illustrating a method for generating a partially sparse generator matrix in accordance with an embodiment of the present disclosure.

Referring to FIG. 3, a flow diagram illustrating a method 300 for generating a partially spare generator matrix is shown. Upon receiving a parity check matrix H in step 302, step 304 rearranges the parity check matrix H by column and row permutations into the following form:

$$H' = \begin{bmatrix} H_{u1} & I_t & 0_{t \times (M-t)} \\ H_{u2} & H_{p1} & H_{p2} \end{bmatrix}$$

Wherein $$\text{rank}(H') = \text{rank}\begin{bmatrix} I_t & 0_{t \times (M-t)} \\ H_{p1} & H_{p2} \end{bmatrix},$$

and $$\begin{bmatrix} I_t & 0_{t \times (M-t)} \\ H_{p1} & H_{p2} \end{bmatrix}$$

is the part of the parity check matrix that corresponds to parity bits. It is noted that H' is by definition also a QC LDPC matrix consists of q×q circulants.

Figure 4:
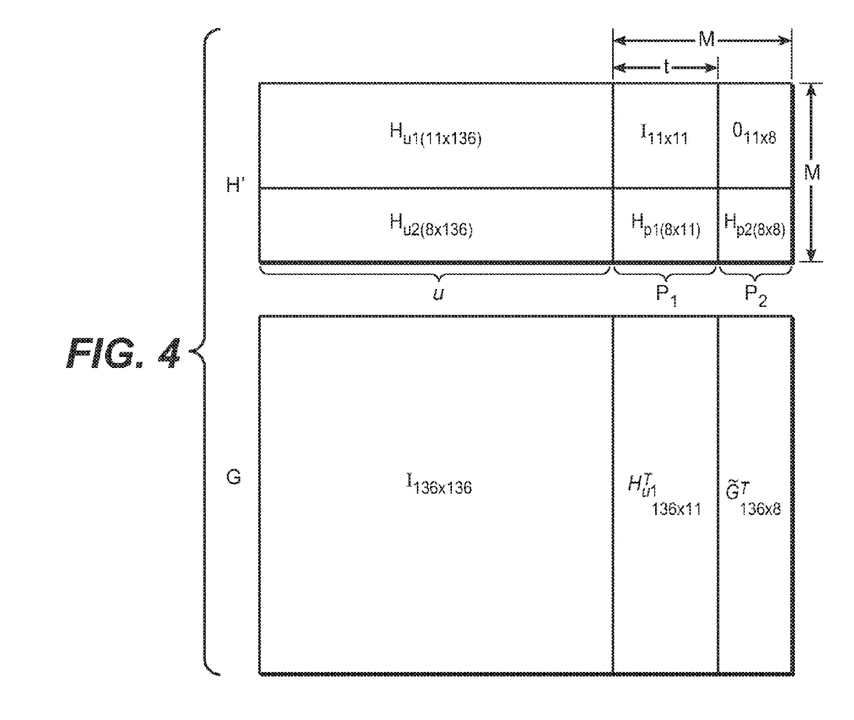
FIG. 4 is an illustration depicting a rearranged parity check matrix and its corresponding generator matrix, wherein q=128, M=19, N=155, and t=11.

More specifically, as illustrated in FIG. 4, for a given parity check matrix H, the H matrix can be rearranged by column and row permutations into the form depicted as H' in FIG. 4.

In accordance with an embodiment of the present disclosure, the larger the size t of the identity matrix in H', the larger the sparse part of the generator matrix G. In one embodiment, step 304 rearranges the parity check matrix H by column and row permutations to maximize the size t of the identity matrix through an exhaustive search.

Once the rearranged matrix H' is obtained, step 306 then constructs the generator matrix G based on this rearranged matrix H'. More specifically, the generator matrix G is constructed as:

$$G = [I_{N-M} H_{u1}^T \tilde{G}^T]$$

Wherein $H_{u1}^T$ is the transpose of $H_{u1}$ and is in block circulant form, and $\tilde{G}^T$ is the dense part of the generator matrix constructed in systematic-circulant form using a similar process as described in sections III and V of: Efficient Encoding of Quasi-Cyclic Low-Density Parity-Check Codes, Zongwang Li et al., IEEE Transactions on Communications, Vol. 54, No. 1 (January 2006). The generator matrix G constructed in this manner is depicted in FIG. 4, which also illustrates the relative size comparison between matrices H' and G.

It is noted that every row of G is a codeword, and The rows in G span the null space of H. For arbitrary input row vector u containing user data, codeword in the code defined by H is of the form c=u·G=[u p1 p2], where parity bits p1 and p2 are computed as: $p1 = u \times H_{u1}^T$ and $p2 = u \times \tilde{G}^T$.

In one embodiment, the computation of $\tilde{G}^T$ is carried out in two steps. First, rows i=1, q+1, 2q+1 . . . of the G matrix are computed. Since the i-th row in G is orthogonal to H and also to $[H_{u2}, H_{p1}, H_{p2}]$, the following equation is valid:

$$h_{u2}^{(i)} + H_{p1} \cdot h_{u1}^{(i)} + H_{p2} \cdot \tilde{g}^{(i)} = 0$$

Wherein superscript (i) denotes the i-th column of the corresponding matrix (e.g. $h_{u2}^{(i)}$ is the i-th column of $H_{u2}$). Since all variables except for $\tilde{g}^{(i)}$ is known, the value of $\tilde{g}^{(i)}$ can be computed based on this equation accordingly. In cases when $H_{p2}$ is non-invertible, a generalized inverse of $H_{p2}$ (which may not be unique) can be utilized. Subsequently, once rows i=1, q+1, 2q+1 . . . of the G matrix are computed, the remaining rows can be obtained as QC shifts of the rows already computed.

It is contemplated that the generator matrix G constructed in this manner is partially sparse, which improves the efficiency of the parity generation process. For instance, a subset of circulant multiplications corresponding to the sparse circulants can be efficiently implemented with barrel shifters, therefore reducing the number of gates per number of parities computed in a single clock cycle. In addition, memory requirements for storing sparse circulants (zero circulants or circulants with column/row weight of one) are much smaller than memory requirements for storing dense circulants.

More specifically, for sparse circulants, a q-bit barrel shifter can provide q parity updates in one clock cycle. For instance, if it is required to update q parities in 16 cycles, in the traditional encoder design, q/16 parity update circuits from FIG. 2 are needed for each circulant $G_{i,j}$. However, in accordance with an embodiment of the present disclosure, if the sub-matrix $G_{i,j}$ being processed is sparse, one q-bit barrel shifter can provide support for up to 16×q parity updates within 16 cycles, significantly reducing the total gate count as well as the memory size.

Figure 5:
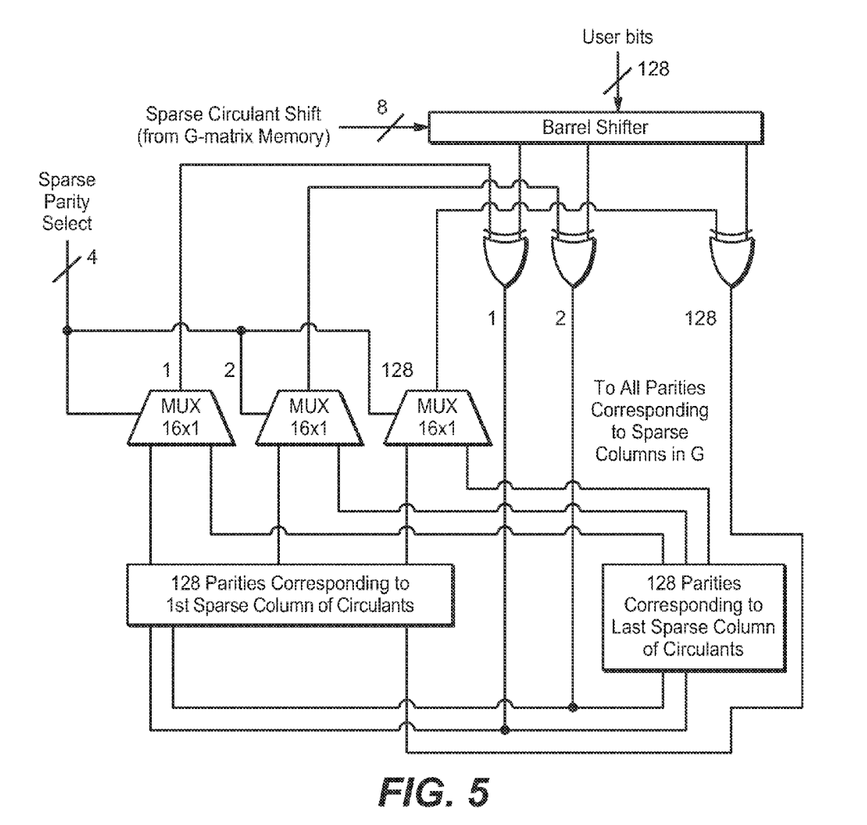
FIG. 5 is a circuitry diagram illustrating an exemplary sparse multiplication circuit that supports up to 16 sparse circulant multiplications in 16 cycles with circulant size 128 and throughtput requirement of 8 bits per clock cycle.
Figure 6:
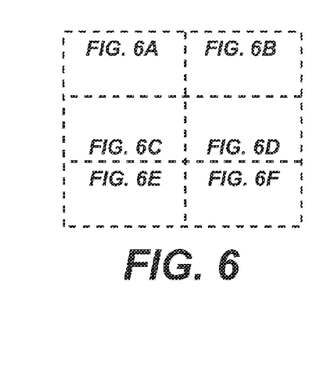
FIG. 6 is an illustration of the relative positions of FIGS. 6A through 6F forming the combined circuitry diagram.
Figure 6A:
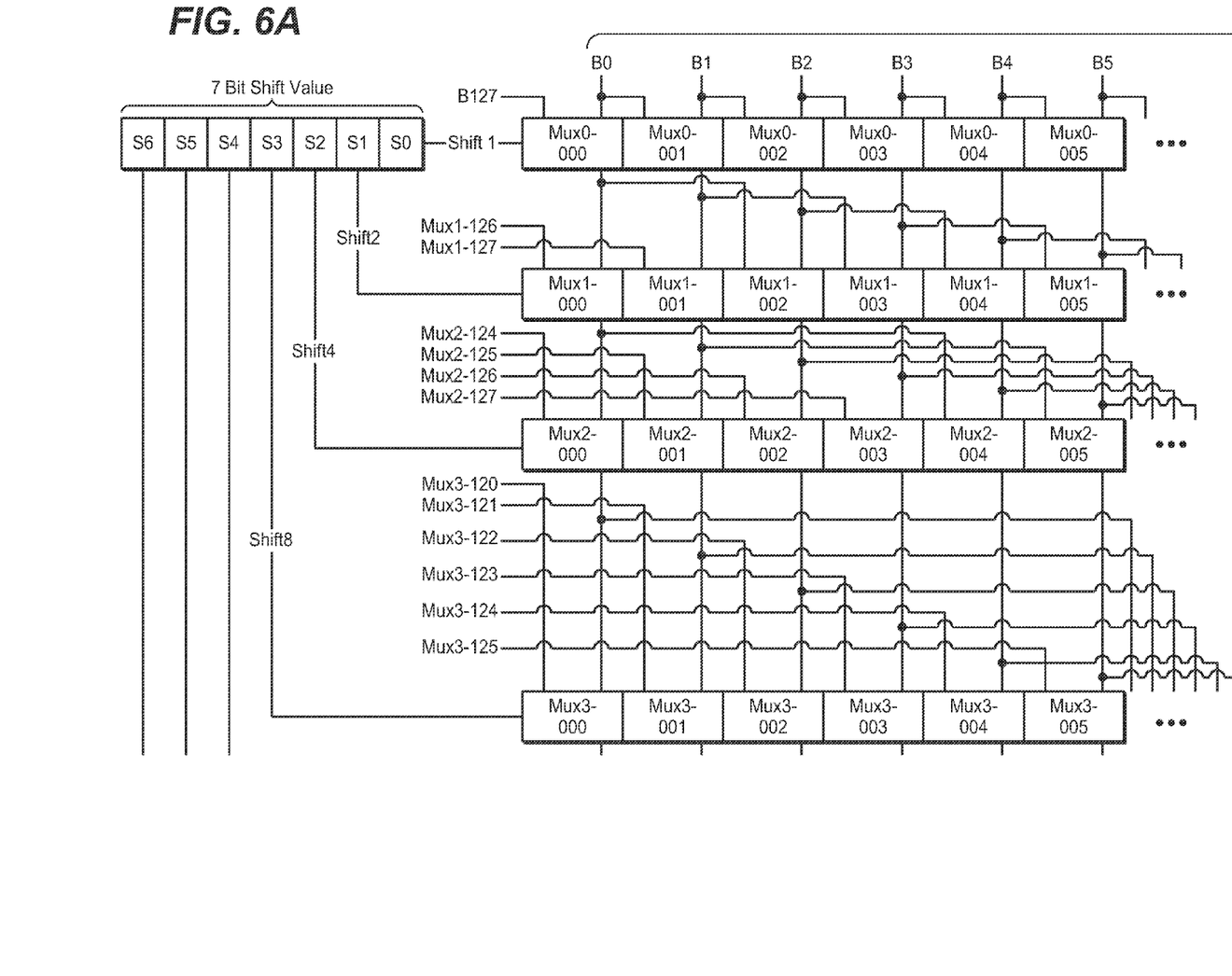
FIG. 6A is a first portion of a circuitry diagram illustrating an exemplary 128-bit barrel shifter (rotator) for the sparse multiplication circuit of FIG. 5.
Figure 6B:
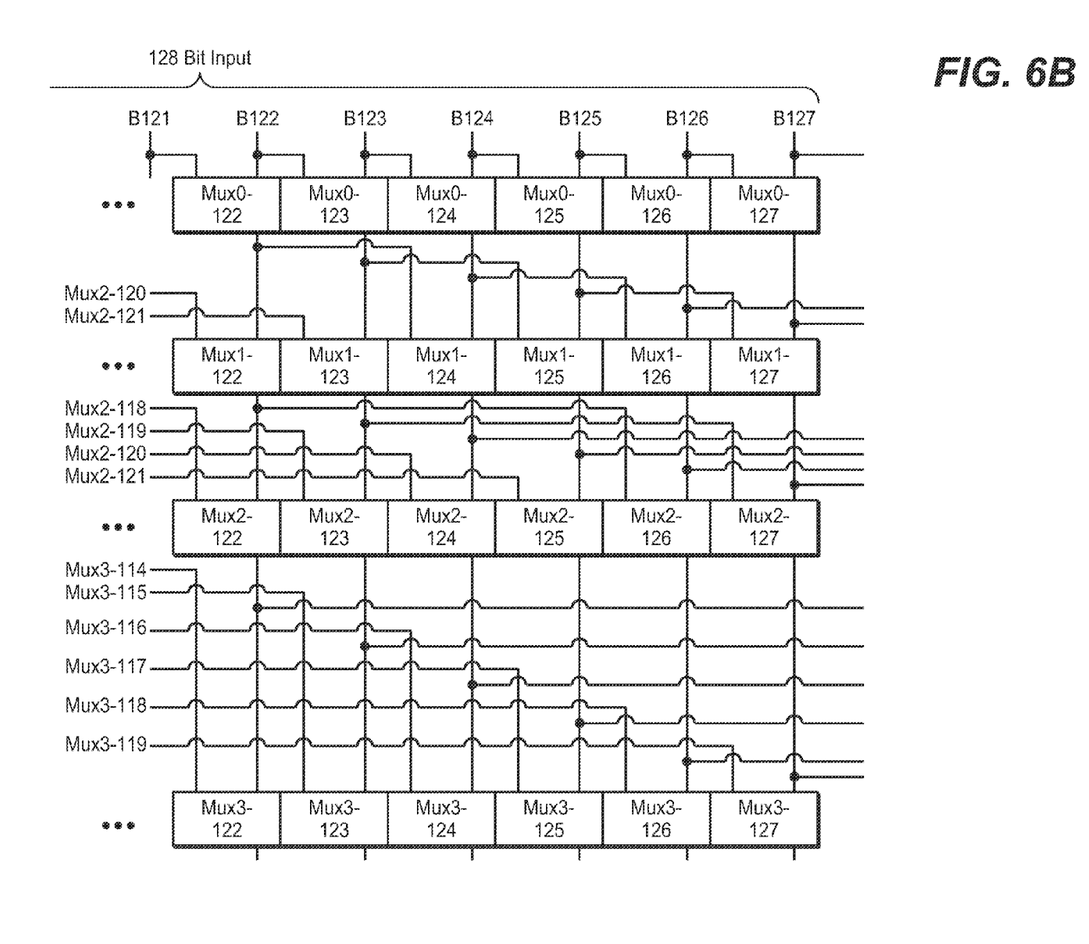
FIG. 6B is a second portion the circuitry diagram illustrating the exemplary 128-bit barrel shifter (rotator) for the sparse multiplication circuit of FIG. 5.
Figure 6C:
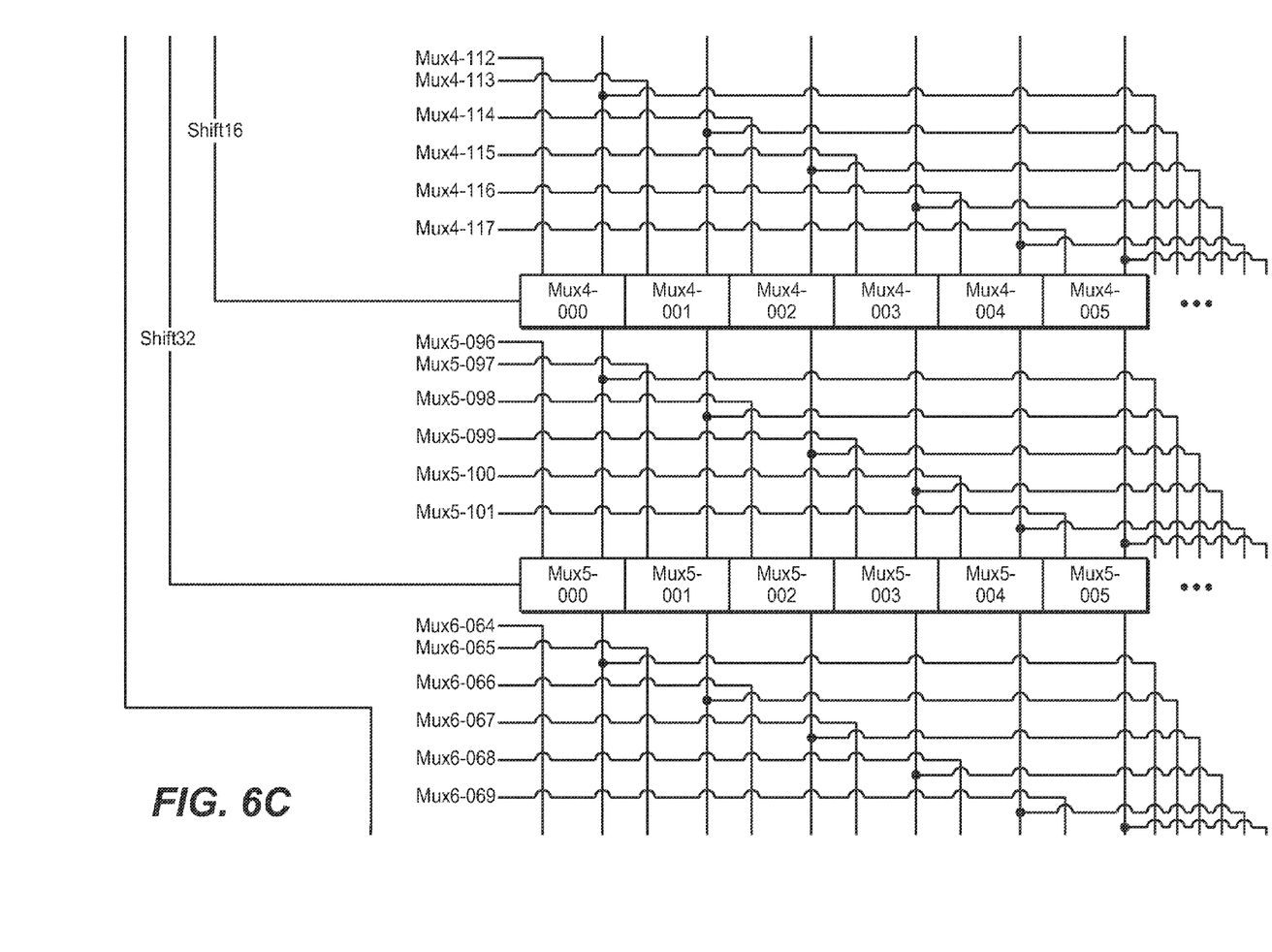
FIG. 6C is a third portion the circuitry diagram illustrating the exemplary 128-bit barrel shifter (rotator) for the sparse multiplication circuit of FIG. 5.
Figure 6D:
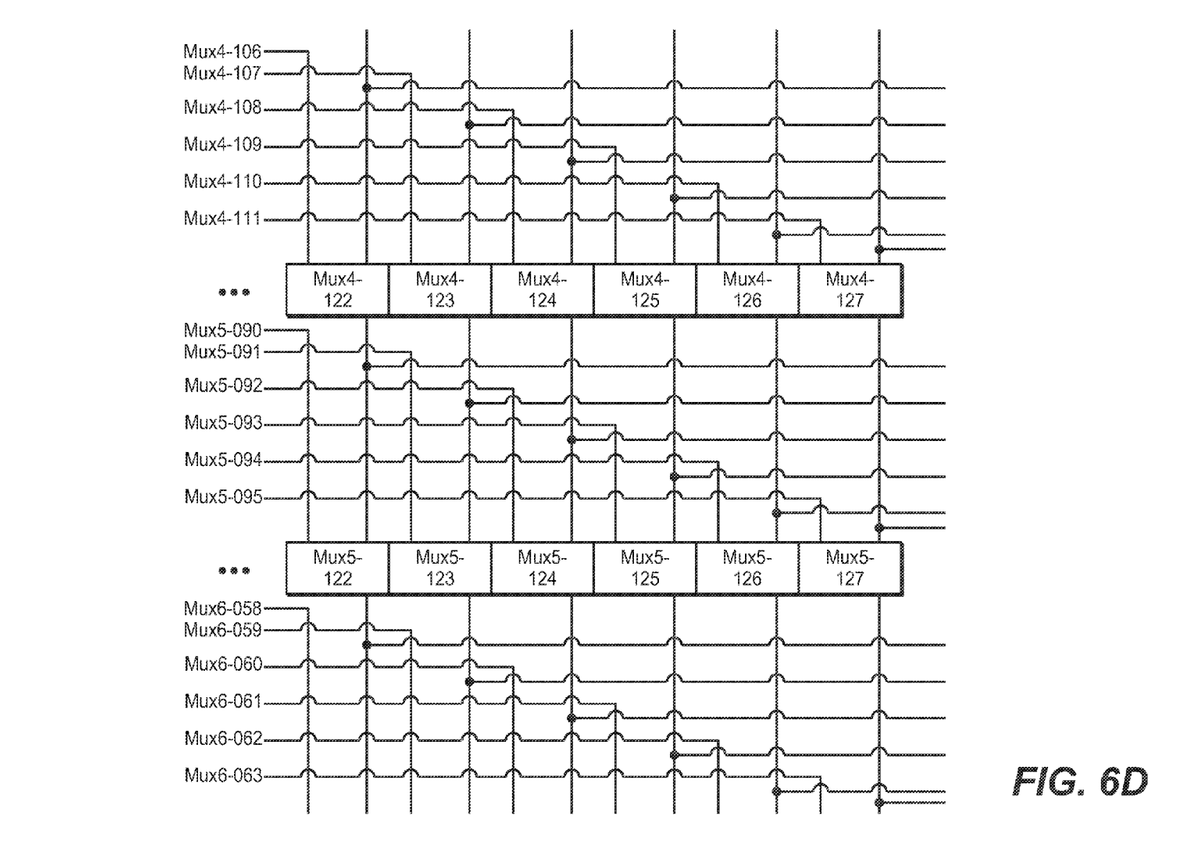
FIG. 6D is a fourth portion the circuitry diagram illustrating the exemplary 128-bit barrel shifter (rotator) for the sparse multiplication circuit of FIG. 5.
Figure 6E:
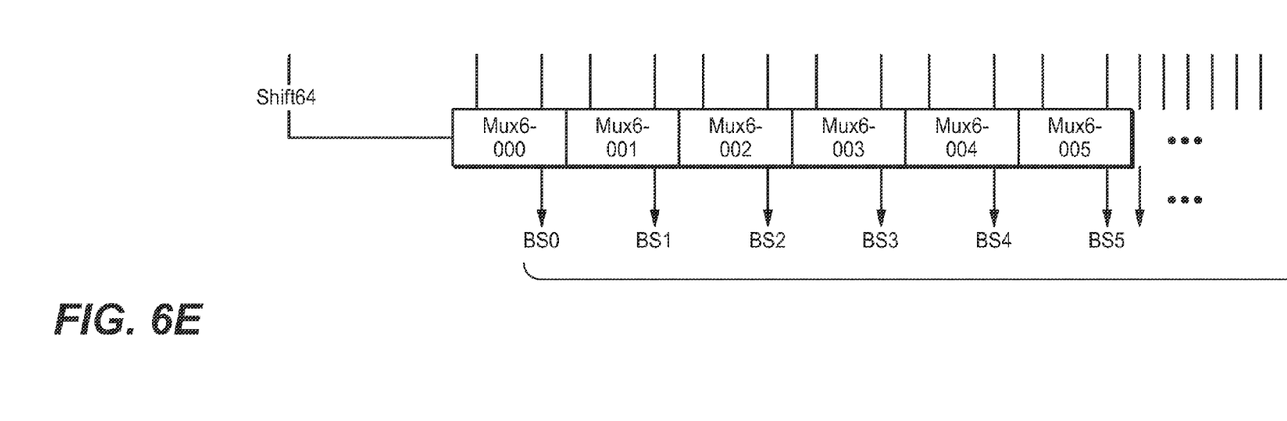
FIG. 6E is a fifth portion the circuitry diagram illustrating the exemplary 128-bit barrel shifter (rotator) for the sparse multiplication circuit of FIG. 5.
Figure 6F:
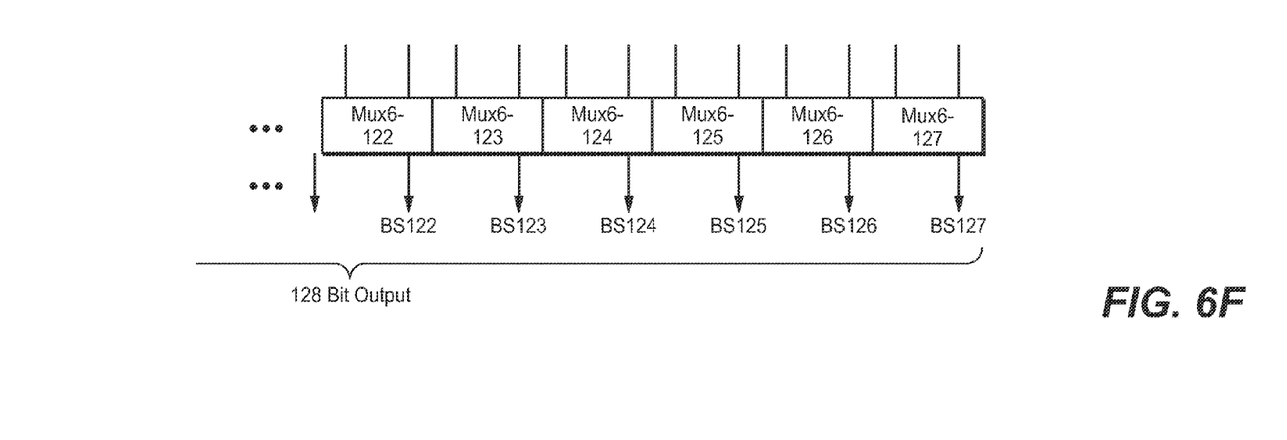
FIG. 6F is a sixth portion the circuitry diagram illustrating the exemplary 128-bit barrel shifter (rotator) for the sparse multiplication circuit of FIG. 5.

For illustrative purposes, suppose q=128 and the throughput requires 8 bits per clock cycle, which means a total of 16 cycles can be used to update all parities from q input bits. FIG. 5 shows an exemplary sparse multiplication circuit capable of satisfying this throughput requirement for sparse circulant multiplication. Since a $2^n$ bit barrel shifter can be implemented with n×$2^n$2×1 MUX, an exemplary 128-bit barrel shifter for sparse circulant multiplication can be implemented using 7×128 2×1 MUX, or the equivalent of 896 XOR and 1792 AND gates. This exemplary barrel shifter (rotator) is depicted in FIG. 6 for illustrative purposes. In addition to the barrel shifter, the sparse circulant multiplier also needs 128 2-input XOR gates for parity updates and 128 16×1 MUX, or the equivalent of 1920 XOR and 3840 AND gates for parity selection. All together, the exemplary 128-bit sparse circulant multiplier contains zero (0) flip-flops, 2.875K XOR gates and 5.5K AND gates, and is capable of processing 16×128 parity updates within 16 cycles.

As shown, for sub-matrices $G_{i,j}$ that are sparse, utilizing q-bit barrel shifter (rotator) to process circulant multiplications is significantly more efficient than using conventional parity update circuits. For sub-matrices $G_{i,j}$ that are dense, on the other hand, any conventional parity update circuit can be utilized. Again, as mentioned previously, in certain embodiments it is advantageous to conduct an exhaustive search in order to maximize the size t of the identity matrix in H' in order to maximize the sparse part of the generator matrix G, which in turn improves the efficiency of the parity update process.

Figure 7:
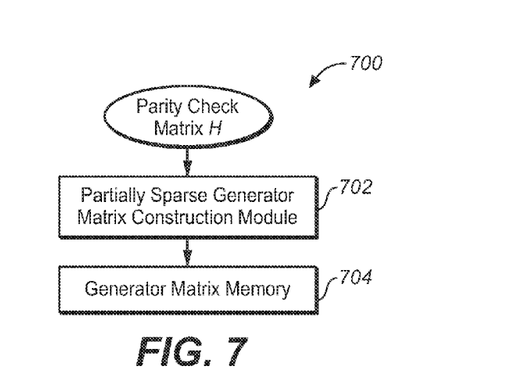
FIG. 7 is a block diagram illustrating a system for generating a partially sparse generator matrix in accordance with an embodiment of the present disclosure.

Referring to FIG. 7, a block diagram illustrating a system 700 for generating a partially spare generator matrix is shown. In one embodiment, a parity check matrix H is provided as input to the generator matrix construction module 702. The generator matrix construction module 702 includes a computer processor in communication with a computer-readable device having computer-executable instructions for performing the method 300 as described above. The output of the generator matrix construction module 702, i.e., the generator matrix G, is then stored in a generator matrix memory 704, which will then be used for the QC LDPC coding process as described above.

It is to be understood that the present disclosure may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for constructing a generator matrix using a Computer processor, the method comprising:
   receiving a parity check matrix $$H = \begin{bmatrix} H_{1,1} & H_{1,2} & \cdots & H_{1,N} \\ H_{2,1} & H_{2,2} & \cdots & H_{2,N} \\ \vdots & \vdots & \ddots & \vdots \\ H_{M,1} & H_{M,2} & \cdots & H_{M,N} \end{bmatrix},$$

wherein each sub-matrix $H_{i,j}$ is a q×q circulant matrix;
   rearranging the parity check matrix H by column and row permutations to obtain a rearranged parity check matrix $$H' = \begin{bmatrix} H_{u1} & I_t & 0_{t\times(M-t)} \\ H_{u2} & H_{p1} & H_{p2} \end{bmatrix};$$

wherein $I_t$ is an identity matrix of size t, $0_{t\times(m-t)}$ is a zero matrix of size t×(M−t), and $H_{u1}, H_{u2}, H_{p1}$ and $H_{p2}$ corresponds to sub-matrices in the rearranged parity check matrix H' identified based on relative positions of the sub-matrices with respect to $I_t$ and $0_{t\times}$(m−t); and
   constructing the generator matrix G=[$I_{N-M}$ $H_{u1}^T$ $\tilde{G}^T$], wherein $I_{N-M}$ is an identity matrix of size N-M, $H_{u1}^T$ is a transpose of $H_{u1}$ and $\tilde{G}^T$ is a part of the generator matrix in systematic-circulant form constructed based on H'.

2. The method of claim 1, wherein rearranging the parity check matrix H by column and row permutations further comprising:
   enumerating a plurality of column and row permutations for the parity check matrix H; and
   selecting one of the plurality of column and row permutations wherein the size of the identity matrix $I_t$ is a largest among the plurality of column and row permutations.

3. The method of claim 1, wherein rearranging the parity check matrix H by column and row permutations further comprising:
   enumerating all possible column and row permutations for the parity check matrix H; and
   selecting one of the plurality of column and row permutations wherein the size of the identity matrix $I_t$ is maximized.

4. The method of claim 1, further comprising:
storing the generator matrix G is a generator matrix memory.

5. The method of claim 4, further comprising:
providing the generator matrix G to a low-density parity-check (LDPC) encoder.

6. The method of claim 5, wherein the LDPC encoder is a quasi-cyclic (QC) LDPC encoder.

7. The method of claim 6, wherein the QC LDPC encoder utilizes a Barrel shifter for parity generations when a sub-matrix $G_{i,j}$ of the generator matrix G is a sparse matrix.

8. A system, comprising:
a generator matrix construction module, the generator matrix construction module configured for:
receiving a parity check matrix $$H = \begin{bmatrix} H_{1,1} & H_{1,2} & \cdots & H_{1,N} \\ H_{2,1} & H_{2,2} & \cdots & H_{2,N} \\ \vdots & \vdots & \ddots & \vdots \\ H_{M,1} & H_{M,2} & \cdots & H_{M,N} \end{bmatrix},$$

wherein each sub-matrix $H_{i,j}$ is a q×q circulant matrix;
rearranging the parity check matrix H by column and row permutations to obtain a rearranged parity check matrix $$H' = \begin{bmatrix} H_{u1} & I_t & 0_{t\times(M-t)} \\ H_{u2} & H_{p1} & H_{p2} \end{bmatrix},$$

wherein $I_t$ is an identity matrix of size t, $0_{t\times(m-t)}$ is a zero matrix of size t×(M×t), and $H_{u1}, H_{u2}, H_{p1}$ and $H_{p2}$ corresponds to sub-matrices in the rearranged parity check matrix H' identified based on relative positions of the sub-matrices with respect to $I_t$ and $0_{t\times(m-t)}$; and
constructing the generator matrix $G=[I_{N-M} \ H_{u1}^T \ \tilde{G}^T]$, wherein $I_{N-M}$ is an identity matrix of size N×M, $H_{u1}^T$ is a transpose of $H_{u1}$ and $\tilde{G}^T$ is a part of the generator matrix in systematic-circulant form constructed based on H'; and
a generator matrix memory in communication with the generator matrix construction module, the generator matrix memory configured for storing the generator matrix G constructed.

9. The system of claim 8, wherein rearranging the parity check matrix H by column and row permutations further comprising:
enumerating a plurality of column and row permutations for the parity check matrix H; and
selecting one of the plurality of column and row permutations wherein the size of the identity matrix $I_t$ is a largest among the plurality of column and row permutations.

10. The system of claim 8, wherein rearranging the parity check matrix H by column and row permutations further comprising:
enumerating all possible column and row permutations for the parity check matrix H; and
selecting one of the plurality of column and row permutations wherein the size of the identity matrix $I_t$ is maximized.

11. The system of claim 8, further comprising:
a low-density parity-check (LDPC) encoder in communication with the generator matrix memory, the LDPC encoder configured for providing LDPC encoding based on the generator matrix G stored in the generator matrix memory.

12. The system of claim 11, wherein the LDPC encoder is a quasi-cyclic (QC) LDPC encoder.

13. The system of claim 12, wherein the QC LDPC encoder utilizes a Barrel shifter for parity generations when a sub-matrix $G_{i,j}$ of the generator matrix G is a sparse matrix.

14. A computer-readable device having computer-executable instructions for performing a method for constructing a generator matrix, the method comprising:
receiving a parity check matrix $$H = \begin{bmatrix} H_{1,1} & H_{1,2} & \cdots & H_{1,N} \\ H_{2,1} & H_{2,2} & \cdots & H_{2,N} \\ \vdots & \vdots & \ddots & \vdots \\ H_{M,1} & H_{M,2} & \cdots & H_{M,N} \end{bmatrix}$$

having a plurality of q×q circulant sub-matrices;
rearranging the parity check matrix H by column and row permutations to obtain a rearranged parity check matrix $$H' = \begin{bmatrix} H_{u1} & I_t & 0_{t\times(M-t)} \\ H_{u2} & H_{p1} & H_{p2} \end{bmatrix},$$

wherein $I_t$ is an identity matrix of size t, $0_{t\times(m-t)}$ is a zero matrix of size t×(M −t), and $H_{u1}, H_{u2}, H_{p1}$ and $H_{p2}$ corresponds to sub-matrices in the rearranged parity check matrix H' identified based on relative positions of the sub-matrices with respect to $I_t$ and $0_{t\times(m-t)}$; and
constructing the generator matrix $G=[I_{N-M} \ H_{u1}^T \ \tilde{G}^T]$ based on H', wherein $I_{N-M}$ is an identity matrix of size N-M, $H_{u1}^T$ is a transpose of $H_{u1}$ and $\tilde{G}^T$ is a part of the generator matrix in systematic-circulant form constructed based on H'.

15. The computer-readable device of claim 14, wherein rearranging the parity check matrix H by column and row permutations further comprising:
enumerating a plurality of column and row permutations for the parity check matrix H to obtain a plurality of rearranged parity check matrices; and
selecting one of the plurality of column and row permutations wherein the size of the identity matrix $I_t$ is a largest among the plurality of rearranged parity check matrices.

16. The computer-readable device of claim 14, wherein rearranging the parity check matrix H by column and row permutations further comprising:
enumerating all possible column and row permutations for the parity check matrix H to obtain all possible rearranged parity check matrices; and
selecting one of the plurality of column and row permutations wherein the size of the identity matrix $I_t$ is maximized.

17. The computer-readable device of claim 14, wherein the method Further comprises:
storing the generator matrix G is a generator matrix memory.

18. The computer-readable device of claim 17, wherein the method Further comprises:
providing the generator matrix G to a low-density parity-check (LDPC) encoder.

19. The computer-readable device of claim 18, wherein the LDPC encoder is a quasi-cyclic (QC) LDPC encoder.

20. The computer-readable device of claim 19, wherein the QC LDPC encoder utilizes a barrel shifter for parity generations when a sub-matrix $G_{i,j}$ of the generator matrix G is a sparse matrix.

\* \* \* \* \*